United States Patent [19]
Hsieh et al.

[11] Patent Number: 5,970,371
[45] Date of Patent: Oct. 19, 1999

[54] METHOD OF FORMING SHARP BEAK OF POLY TO IMPROVE ERASE SPEED IN SPLIT-GATE FLASH EEPROM

[75] Inventors: Chia-Ta Hsieh, Tainan; Hung-Cheng Sung, Hsin-Chu; Yai-Fen Lin, Taichung; Chuang-Ke Yeh, Hsin-Chu; Di-Son Kuo, Hsinchu, all of Taiwan

[73] Assignee: Taiwan Semiconductor Manufacturing Company, Ltd., Hsin-Chu, Taiwan

[21] Appl. No.: 09/110,418

[22] Filed: Jul. 6, 1998

[51] Int. Cl.⁶ .................................................. H01L 21/336
[52] U.S. Cl. .......................... 438/593; 438/266; 438/264
[58] Field of Search ................................. 438/264, 266, 438/FOR 203, 593

[56] References Cited

U.S. PATENT DOCUMENTS

| 5,067,108 | 11/1991 | Jeng | 365/185 |
|---|---|---|---|
| 5,422,292 | 6/1995 | Hong et al. | 437/43 |
| 5,614,747 | 3/1997 | Ahn et al. | 257/316 |
| 5,652,161 | 7/1997 | Ahn | 437/43 |

*Primary Examiner*—George Fourson
*Assistant Examiner*—Glenn Whichard
*Attorney, Agent, or Firm*—George O. Saile; Stephen B. Ackerman

[57] ABSTRACT

A method is provided for forming a split-gate flash memory cell having a sharp beak of poly which substantially improves the programming erase speed of the cell. The sharp beak is formed through an extra and judicious wet etch of the polyoxide formed after the oxidation of the first polysilicon layer. The extra oxide dip causes the polyoxide to be removed peripherally thus forming a re-entrant cavity along the edge of the floating gate. The re-entrant beak is such that it does not get damaged during the subsequent process steps and is especially suited for cell sizes smaller than 0.35 micrometers.

20 Claims, 4 Drawing Sheets

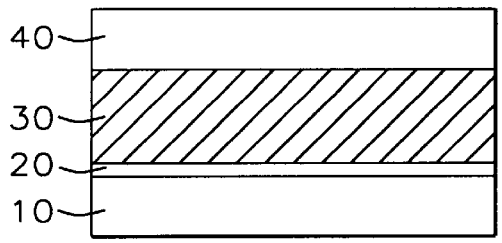
FIG. 1a – Prior Art
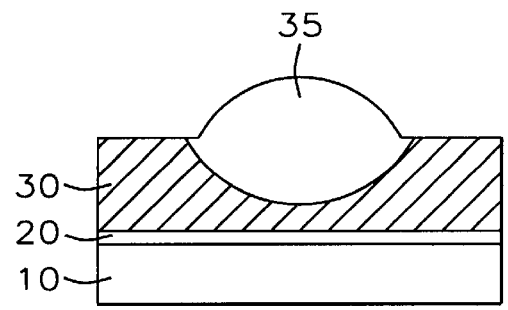
FIG. 1d – Prior Art
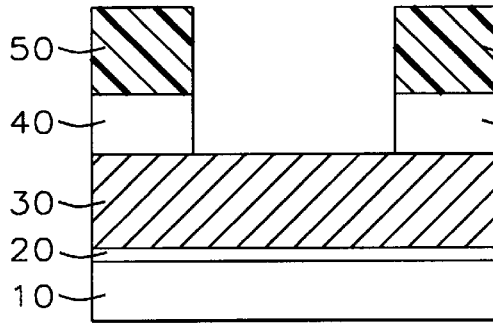
FIG. 1b – Prior Art
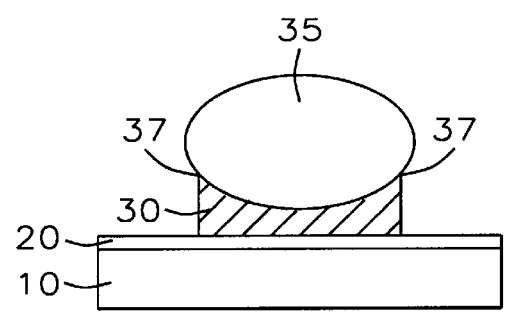
FIG. 1e – Prior Art
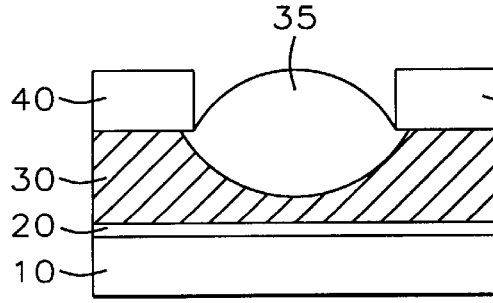
FIG. 1c – Prior Art
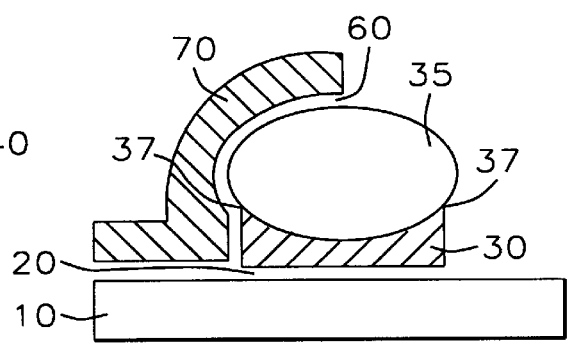
FIG. 1f – Prior Art

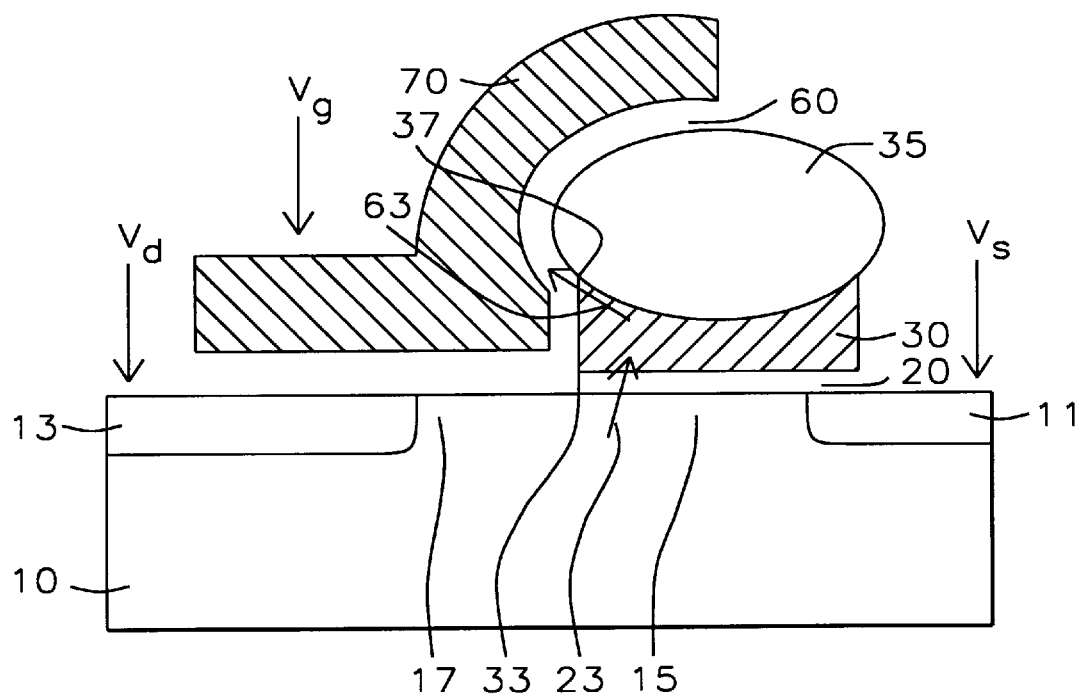
FIG. 1g – Prior Art

METHOD OF FORMING SHARP BEAK OF POLY TO IMPROVE ERASE SPEED IN SPLIT-GATE FLASH EEPROM

BACKGROUND OF THE INVENTION

(1) Field of the Invention

The present invention relates to split-gate memory cells used in flash EEPROMs (Electrically Erasable Programmable Read Only Memories), and in particular, to a method of forming a sharp peak of poly to improve erase speed in split-gate flash cell.

(2) Description of the Related Art

The shape and size of different portions of memory cells have different effects on the performance of the memory cells in different ways. Thus, with the one-transistor memory cell, which contains one transistor and one capacitor, many variations of this simple cell have been advanced for the purposes of shrinking the size of the cell and, at the same time, improve its performance. The variations consist of different methods of forming capacitors, with single, double or triple layers of polysilicon, and different materials for the word and bit lines. Another variation which is disclosed in this invention relates to the shape of the edge of the floating gate which significantly affects the erase speed of split-gate flash memory cells.

Memory devices include electrically erasable and electrically programmable read-only memories (EEPROMs) of flash electrically erasable and electrically programmable read-only memories (flash EEPROMs). Many types of memory cells for EEPROMs or flash EEPROMs may have source and drains regions that are aligned to a floating gate or aligned to spacers. When the source and drain regions are aligned to the floating gate, a gate electrode for a select transistor is separate from the control gate electrode of the floating gate transistor. Separate select and control gates increase the size of the memory cell. If the source and drain regions are aligned to a spacer formed after the floating gate is formed, the floating gate typically does not overlie portions of the source and drain regions. Programming and erasing performance is degraded by the offset between the floating gate and source and drain regions.

Most conventional flash-EEPROM cells use a double-polysilicon (poly) structure of which the well known split-gate cell is shown in FIGS. 1g. The forming of the cell is shown in FIGS. 1a–1f which will be described shortly. In the final form of the cell shown in FIG. 1g, a MOS transistor is formed on a semiconductor substrate (10) having a first doped region (11), a second doped region (13), a channel region (15), a gate oxide (20), a floating gate (30), intergate dielectric layer (60) and control gate (70). Substrate (10) and channel region (15) have a first conductivity type, and the first (11) and second (13) doped regions have a second conductivity type that is opposite the first conductivity type.

As seen in FIG. 1g, the first doped region, (11), lies within the substrate. The second doped region, (13), lies within substrate (10) and is spaced apart form the first doped region (11). Channel region (15) lies within substrate (10) and between first (11) and second (13) doped regions. Gate oxide layer (20) overlies substrate (10). Floating gate (30), to which there is no direct electrical connection, and which overlies substrate (10), is separated from substrate (10) by a thin layer of gate oxide (20) while control gate (70), to which there is direct electrical connection, is generally positioned over the floating gate with intergate oxide (60) therebetween.

In the structure shown in FIG. 1g, control gate (70) overlaps the channel region, (17), adjacent to channel (15) under the floating gate, (30). This structure is needed because when the cell is erased, it leaves a positive charge on the floating gate. As a result, the channel under the floating gate becomes inverted. The series MOS transistor (formed by the control gate over the channel region) is needed in order to prevent current flow from control gate to floating gate. The length of the transistor, that is the overlap of the control gate over the channel region (17) determines the cell performance. Furthermore, the shape of the edge (33) and, in particular, that of edge (37) can affect the programming of the cell. It is disclosed in this invention that the shape and size of edge (37) will affect the programming erase speed of the cell substantially. The relatively rounded shape that is found in conventional cells shown in FIG. 1g and which affects the erase speed adversely is the result of the commonly used process which is illustrated in FIGS. 1a–1f.

In FIG. 1a, layer of gate oxide (20) is thermally grown over substrate (10) using conventional methods. Next, a first polysilicon layer (30) is formed followed by the deposition of nitride layer (40). A photoresist layer (50) is then spun over the substrate and then patterned with a floating gate pattern, which in turn, is etched into the nitride layer as shown in FIG. 1b. The photoresist layer, which is no longer needed, is removed. Next, the first polysilicon that is exposed in the pattern openings in the nitride layer is oxidized to form polyoxide (35) as shown in FIG. 1c. Subsequently, the nitride layer is removed leaving the polyoxide as shown in FIG. 1d, where now the polyoxide serves as a hard mask to remove all the first polysilicon portions except those that are covered by the polyoxide. As is well known in the art, this is usually accomplished by main etch followed by over-etch. It is at this etching step that the corner edge (37) is usually rounded off, as seen in FIG. 1e, which is not desirable for achieving fast program erase speed described below. It will be shown later in the embodiments of this invention that by employing a different process step, the sharpness of corner edge (37) can be preserved such that charge transfer (23) between substrate (10) and floating gate (30), and then the charge transfer (63) between the floating gate and control gate, (70), is fast. The Control gate is formed by depositing a second polysilicon layer over intergate layer (60), also known as interpoly, which separates the two polysilicon layers, namely, the floating polygate and the control polygate.

To program the transistor shown in FIG. 1g, which is an enlarged view of FIG. 1f as well as showing the placement of gate, source and drain voltages or Vg, $V_s$ and $V_d$, respectively, charge is transferred from substrate (10) through gate oxide (20) and is stored on floating gate (30) of the transistor. The amount of charge is set to one of two levels to indicate whether the cell has been programmed "on" of "off." "Reading" of the cell's state is accomplished by applying appropriate voltages to the cell source (11) and drain (13), and to control gate (70), and then sensing the amount of charge on floating gate (30). To erase the contents of the cell, the programming process is reversed, namely, charges are removed from the floating gate by transferring them back to the substrate through the gate oxide.

This programming and erasing of an EEPROM is accomplished electrically and in-circuit by using Fowler-Nordheim tunneling as is well known in prior art. Basically, a sufficiently high voltage is applied to the control gate and drain while the source is grounded to create a flow of electrons in the channel region in the substrate. Some of these electrons gain enough energy to transfer from the substrate to the floating gate through the thin gate oxide layer by means of Fowler-Nordheim tunneling. The tunneling is achieved by raising the voltage level on the control gate to a sufficiently high value of about 12 volts. As the electronic charge builds up on the floating gate, the electric field is reduced, which reduces the electron flow. When, finally, the high voltage is removed, the floating gate remains charged to a value larger than the threshold voltage of a logic high that would turn it on. Thus, even when a logic high is applied to the control gate, the EEPROM remains off. Since tunneling process is reversible, the floating gate can be erased by grounding the control gate and raising the drain voltage, thereby causing the stored charge on the floating gate to flow back to the substrate. Of importance in the tunneling region is the quality and the thinness of the tunneling oxide separating the floating gate from the substrate. Usually a thickness of between about 80 to 120 Angstroms is required to facilitate Fowler-Nordheim tunneling.

Several different methods of forming split-gate flash memory cells are described in prior art. Ahn in U.S. Pat. No. 5,652,161 is concerned about the degradation of the tunnel oxide in a flash EEPROM cell due to the band-to-band tunneling and the secondary hot carrier which are generated by a high electric field formed at the overlap regions between the junction region and the gate electrode when programming and erasure operations are performed by a high voltage to the structure in which the tunneling region is separated from the channel with a thick insulation film. In a separate U.S. Pat. No. 5,614,747, Ahn, et al., disclose a different method for manufacturing a flash EEPROM cell in order to prevent over-erasure of the cell and decrease the cell area by forming a floating gate in the form of a spacer on a side wall of a select gate and by forming a control gate to surround the select gate and the floating gate.

Hong, et al, describe in U.S. Pat. No. 5,422,292 another process for fabricating split-gate flash EEPROM memory where the isolation between the floating gate and the control gate is improved by using a first and second oxide layer so that the problem of leakage does not occur. Jeng, on the other hand, discloses a method of re-crystallizing a floating gate for the purposes of maximizing the coupling between the floating gate and the drain and the portion of the channel regions over which the gate is disposed.

In addition to these prior methods, what is needed is a method for improving the program erase speed of split-gate flash memory cells by shaping the edge of the floating gate as disclosed in the present invention.

SUMMARY OF THE INVENTION

It is therefore an object of this invention to provide method of forming a sharp beak of polygate to improve erase speed in split-gate flash memory.

It is another object of this invention to provide a split-gate flash memory having a re-entrant sharp beak of polygate to improve erase speed in split-gate flash memory.

These objects are accomplished by providing a silicon substrate having a plurality of active and field regions defined; forming a tunnel oxide layer over said substrate; forming a first polysilicon layer over said tunnel oxide layer; forming a layer of nitride over said tunnel oxide layer; forming and patterning a first photoresist layer to form a photoresist mask with a pattern corresponding to the floating gate of said split-gate flash memory cell; etching said layer of nitride through said photoresist mask to form openings in said layer of nitride and to expose portions of said first polysilicon layer corresponding to said floating gate pattern; removing said first photoresist layer; oxidizing portions of said first polysilicon layer exposed in said openings in said layer of nitride to form a polyoxide; removing said layer of nitride; using said polyoxide as a hard mask to etch portions of said first polysilicon layer not covered by said polyoxide hard mask to form floating gate underlying said polyoxide; removing exposed peripheral portions of said polyoxide until said polyoxide is recessed into said floating gate forming a sharp beak of poly; forming interpoly oxide over said polyoxide; depositing a second polysilicon layer over said interpoly oxide; and patterning said second polysilicon layer with a second photoresist mask having control gate pattern to form a control gate to complete the forming of said split-gate flash memory cell with said sharp beak of poly to improve erase speed of said memory.

These objects are further accomplished by forming a split-gate flash memory cell having a sharp beak of poly which substantially improves the programming erase speed of the cell. The sharp beak is formed through an extra and judicious wet etch of the polyoxide formed after the oxidation of the first polysilicon layer. The extra oxide dip causes the polyoxide to be removed peripherally thus forming a re-entrant cavity along the edge of the floating gate. The re-entrant beak is such that it does not get damaged during the subsequent process steps and is especially suited for cell sizes smaller than 0.35 micrometers.

BRIEF DESCRIPTION OF THE DRAWINGS

FIGS. 1a–1g are cross-sectional views of a portion of a semiconductor substrate showing the steps of forming a conventional split-gate flash memory cell with a conventional gate birds' beak.

DESCRIPTION OF THE PREFERRED EMBODIMENTS

Figure 2A:
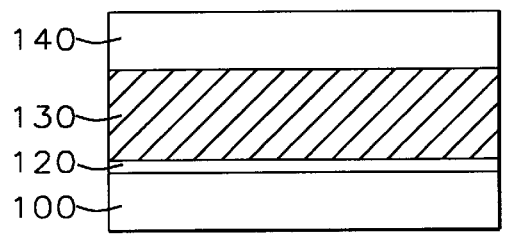
FIG. 2a is a cross-sectional view of a portion of a semiconductor substrate showing the forming of tunnel oxide, first polysilicon layer and a layer of nitride thereon according to this invention.

Referring now to the drawings, in particular to FIGS. 2a–2g, there are shown schematically steps of forming a split-gate flash memory cell having a sharp beak of poly wherein poly forms the floating gate of the cell. It will become apparent from the figures that the shape and size of the beak is important in that the Fowler-Nordheim (F-N) tunneling that is used in programming and erasing of an EEPROM cell is enhanced usually by providing, what is known as a gate bird's beak (GBB) at the corner of a gate structure of the memory cell. However, the conventional "beak" of the bird's beak is usually long and elongated, thus increasing the size of the cell and at the same time providing paths for current leakage and, therefore, low memory speed. Also, the GBB, because it is long, is easily damaged during the subsequent process steps such as during the forming of the interpoly oxide over the floating gate. Thus, in order to alleviate some of these problems, a different method of forming the beak is disclosed in the embodiment specified below.

In FIG. 2a, substrate (100), preferably silicon, is provided with active device regions, and passive field regions already defined (not shown) as is well known in the art. As shown in FIG. 2a, a tunnel oxide layer, (120), is first formed on substrate (100). Tunnel oxide (120) can be formed by thermal oxidation process at a temperature between about 800° C. to 900° C. Alternatively, the tunnel oxide can be formed by an atmospheric or low pressure chemical vapor deposition (LPCVD) process as is well known. Tunnel oxide layer (120) has a thickness between about 80 to 90 angstroms (Å).

A first polysilicon layer (130) is next deposited over the tunnel oxide through reduction of $SiH_4$ using LPCVD at a temperature between about 600 to 650° C. The preferred thickness of the first layer of polysilicon is between about 1100 to 1300 Å. This is followed by the forming of a layer of nitride (140) by reacting dichlorosilane ($SiCl_2H_2$) with ammonia ($NH_3$) in an LPCVD at a temperature between about 750 to 850° C. The preferred thickness of the nitride layer is between about 750 to 850 Å.

Figure 2D:
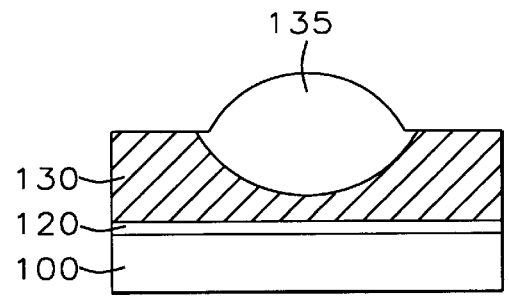
FIG. 2d is a cross-sectional view of a portion of a semiconductor substrate showing the removal of the nitride layer of FIG. 2c, according to this invention.
Figure 2B:
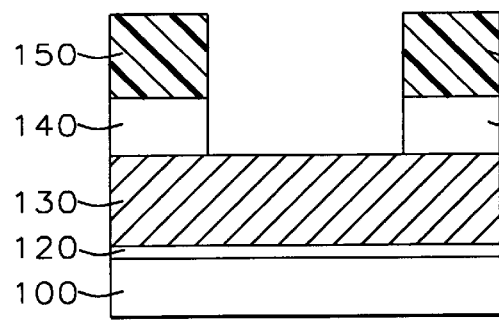
FIG. 2b is a cross-sectional view of a portion of a semiconductor substrate showing the patterning of the nitride layer of FIG. 2a with a photoresist mask, according to this invention.

At the next step, using conventional techniques, a first photoresist layer (150) is spun over the nitride layer to form a photoresist mask having patterns corresponding to areas where floating gates are to be defined. The patterns are then etched into the nitride layer forming openings where the underlying polysilicon layer is exposed, as shown in FIG. 2b. The etching is accomplished using a recipe comprising gases Ar, $CHF_3$, $C_4F_8$. Afterwards, the photoresist mask is removed using oxygen plasma ashing as is done conventionally.

Figure 2E:
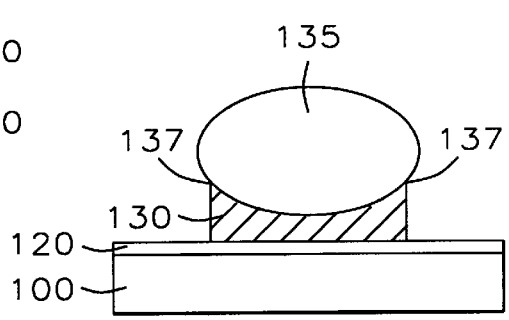
FIG. 2e is a cross-sectional view of a portion of a semiconductor substrate showing the forming of the floating gate by using the polyoxide of FIG. 2d as a hard mask, according to this invention.
Figure 2C:
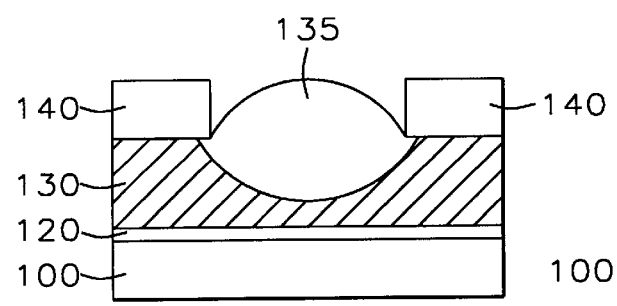
FIG. 2c is a cross-sectional view of a portion of a semiconductor substrate showing the forming of the polyoxide in the patterned openings of FIG. 2b, according to this invention.

The portions of the underlying polysilicon layer exposed in the patterned openings of the nitride layer are next oxidized using a wet process comprising water or wet $O_2$. It is preferred that the polysilicon is doped prior to the oxidation inasmuch as doped polysilicon, with phosphorous, for example, oxidizes more rapidly than undoped polysilicon. The resulting oxidation produces polyoxide as shown in FIG. 2c. The preferred thickness of the polyoxide (135) is between about 1400 to 1600 Å. Once the polyoxide has been formed, the nitride layer is removed by using a wet solution of $H_3PO_4$, or, phosphoric acid, as shown in FIG. 2d. The same etch recipe used for patterning the nitride layer before may be used to remove the remaining nitride layer. The polyoxide so formed is now used as a hard mask to etch the remaining portions of the first polysilicon layer not covered by the polyoxide mask as shown in FIG. 2e. This is accomplished by using an etch recipe comprising $Cl_2$ and HBr gases. The polysilicon layer protected under the polyoxide forms the floating gate of this invention which is separated from the substrate by the tunnel oxide layer (120) as seen in FIG. 2e.

It will be noted in FIG. 2e that the shape and size of the polyoxide over the floating polygate is generally rounded, even after performing over-etch. Furthermore, the over-etch usually results in the forming of the well known gate bird's beak with the attendant encroachment under the polysilicon edge (not shown). Also, the relatively long GBB readily gets damaged during the subsequent processing steps. Consequently, in operation in a conventional cell such as shown in FIG. 1g, the programming erase speed is adversely affected. In order to circumvent these problems, and as a main feature and key aspect of the present invention, the polyoxide so formed as shown in FIG. 2e is further dipped in an oxide etch to remove peripheral portions of the polyoxide so as to be disposed in a recess over the floating gate as shown in FIG. 2f.

Figure 2F:
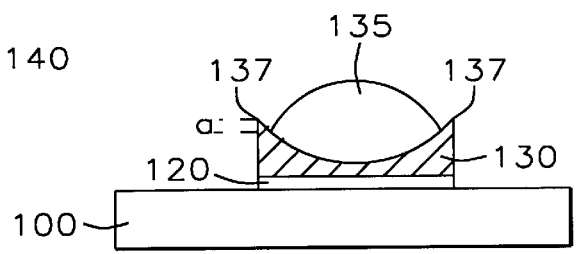
FIG. 2f is a cross-sectional view of a portion of a semiconductor substrate showing the forming of the re-entrant sharp beak of this invention by performing an extra oxide etch dip of the polyoxide of FIG. 2e, according to this invention.

Of importance in the process step of FIG. 2f is the wet oxide etch recipe comprising an aqueous solution of HF (hydrogen fluoride), or, hydrofluoric acid. It is critical that an amount between about 100 to 200 Å of the polyoxide be removed during this extra oxide dip. This forms a re-entrant sharp beak (137) as confirmed by scanning electron microscope photographs (SEM) and as schematically depicted in FIG. 2f. Length (a) of the beak, seen in FIG. 2f, from the bottom of the re-entrant cavity to the tip of the beak is between about 50 to 150 Å.

Figure 2G:
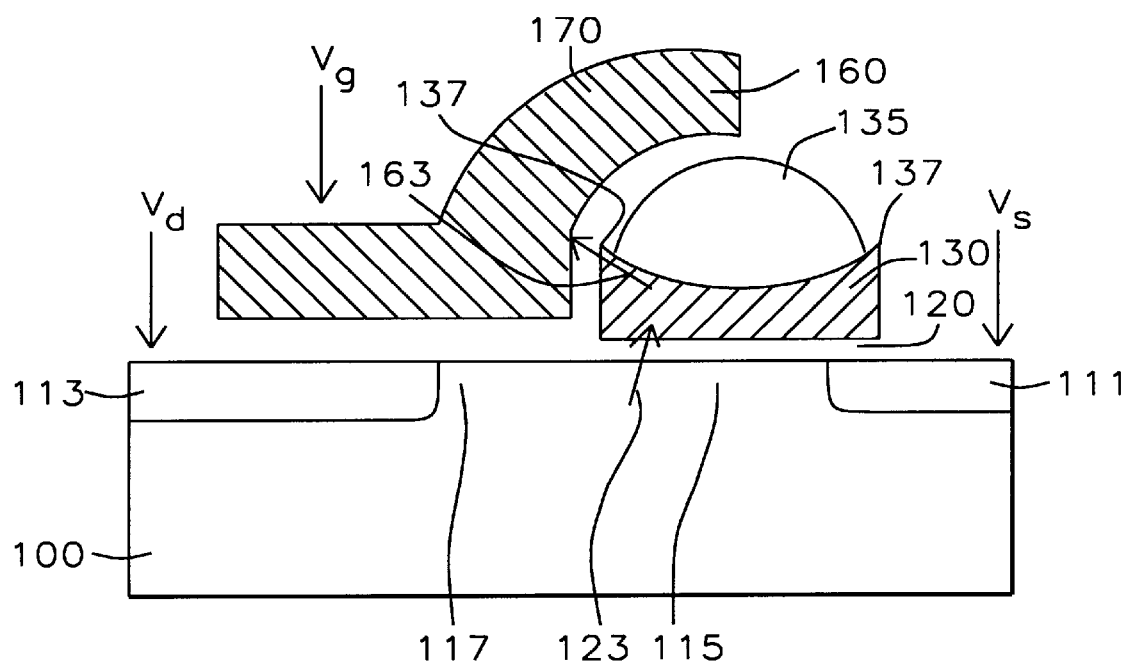
FIG. 2g is a cross-sectional view of a portion of a semiconductor substrate showing the completion of the split-gate flash memory cell with the re-entrant sharp beak of this invention.

The penultimate step of completing the forming of the split-gate memory cell structure is accomplished first by depositing an interpoly oxide (160) as shown in FIG. 2g. It is preferred that layer (160) is oxynitride, which is well known in the art, and that it has a thickness between about 200 to 300 Å. At the final step, a second layer of polysilicon is deposited over interpoly oxide (160) and is patterned to form the control gate, (170), as shown in the same FIG. 2g. It is preferred that the second layer of polysilicon is formed using silicon source $SiH_4$ in an LPCVD chamber at a temperature between about 550 to 620° C., and that it has a thickness between about 1500 to 2500 Å.

In comparing the split-gate flash memory of this invention shown in FIG. 2g with that of prior art shown in FIG. 1g, it will be appreciated by those skilled in the art that with the disclosed smaller and sharper beak of poly of this invention in comparison with the GBB of prior art, the smaller is the encroachment under the polysilicon edge, and sharper and more coherent is the charge transfer between the corner of the floating gate and the control gate, thus, faster is the erase speed.

To program the transistor shown in FIG. 2g, charge is transferred from substrate (100) through gate oxide (120) and is stored on floating gate (130) of the transistor, similar to the programming of the transistor shown in FIG. 1g. The amount of charge is set to one of two levels to indicate whether the cell has been programmed "on" of "off." "Reading" of the cell's state is accomplished by applying appropriate voltages to the cell source (111) and drain (113), and to control gate (170), and then sensing the amount of charge on floating gate (130). To erase the contents of the cell, the programming process is reversed, namely, charges are removed from the floating gate by transferring them back to the substrate through the gate oxide. Thus, the sharpness of corner edge (137) is preserved in this invention such that charge transfer (123) between substrate (100) and floating gate (130), and then the charge transfer (163) between the floating gate and control gate, (170), is fast.

Though these numerous details of the disclosed method are set forth here, such as process and device parameters, to provide an understanding of the present invention, it will be obvious, however, to those skilled in the art that these specific details need not be employed to practice the present invention. At the same time, it will be evident that the same methods may be employed in other similar process steps that are too many to cite, such as, for example, for forming sharp beak of poly of different re-entrant lengths.

That is to say, while the invention has been particularly shown and described with reference to the preferred embodiments thereof, it will be understood by those skilled in the art that various changes in form and details may be made without departing from the spirit and scope of the invention.

What is claimed is:

1. A method of forming a beak of poly to improve erase speed in a split-gate flash memory cell comprising the steps of:

providing a silicon substrate having a plurality of active and field regions defined;

forming a tunnel oxide layer over said substrate;

forming a first polysilicon layer over said tunnel oxide layer;

forming a layer of nitride over said tunnel oxide layer;

forming and patterning a first photoresist layer to form a photoresist mask with a pattern corresponding to the floating gate of said split-gate flash memory cell;

etching said layer of nitride through said photoresist mask to form openings in said layer of nitride and to expose portions of said first polysilicon layer corresponding to said floating gate pattern;

removing said first photoresist layer;

oxidizing portions of said first polysilicon layer exposed in said openings in said layer of nitride to form a polyoxide;

removing said layer of nitride;

using said polyoxide as a hard mask to etch portions of said first polysilicon layer not covered by said polyoxide hard mask to form floating gate underlying said polyoxide;

removing exposed peripheral portions of said polyoxide until said polyoxide is recessed into said floating gate forming a beak of poly;

forming interpoly oxide over said polyoxide;

depositing a second polysilicon layer over said interpoly oxide; and patterning said second polysilicon layer with a second photoresist mask having control gate pattern to form a control gate to complete the forming of said split-gate flash memory cell with said sharp beak of poly to improve erase speed of said memory.

2. The method of claim 1, wherein said forming a tunnel oxide layer is accomplished by thermal growth at a temperature between about 850 to 950° C.

3. The method of claim 2, wherein said tunnel oxide layer has a thickness between about 80 to 90 angstroms (Å).

4. The method of claim 1, wherein said forming a first polysilicon layer is accomplished with silicon source $SiH_4$ using LPCVD at a temperature between about 550 to 620° C.

5. The method of claim 1, wherein said first polysilicon layer has a thickness between about 1100 to 1300 angstroms (Å).

6. The method of claim 1, wherein said forming a layer of nitride is accomplished with LPCVD at a temperature between about 750° C. to 850° C. by reacting dichlorosilane ($SiCl_2H_2$) with ammonia ($NH_3$).

7. The method of claim 6, wherein the thickness of said layer of nitride is between about 750 to 850 Å.

8. The method of claim 1, wherein said photoresist mask has thickness between about 0.8 to 1.0 micrometers ($\mu$m).

9. The method of claim 1, wherein said etching said layer of nitride is accomplished with etch recipe comprising Ar, $CHF_3$, $C_4F_8$.

10. The method of claim 1, wherein said removing said first photoresist layer is accomplished by oxygen plasma ashing.

11. The method of claim 1, wherein said oxidizing portions of said first polysilicon layer to form polyoxide is accomplished by wet oxidation at a temperature between about 850 to 950° C.

12. The method of claim 11, wherein the thickness of said polyoxide is between about 1400 to 1600 Å.

13. The method of claim 1, wherein said removing said layer of nitride is accomplished with a wet etch solution comprising $H_3PO_4$.

14. The method of claim 1, wherein said etching said first polysilicon layer using said polyoxide as a hard mask is accomplished with a recipe comprising gases HBr, and $Cl_2$.

15. The method of claim 1, wherein said removing exposed peripheral portions of said polyoxide until said polyoxide is recessed into said floating gate is accomplished with an etch recipe comprising an aqueous solution of HF (hydrogen fluoride), or, hydrofluoric acid.

16. The method of claim 15, wherein said oxide etch dip removes said peripheral portions of said polyoxide in the amount between about 100 to 200 Å.

17. The method of claim 15, wherein said recess of said polyoxide into said floating gate forms a re-entrant beak at the edge of said floating gate having a length between about 50 to 150 Å.

18. The method of claim 1, wherein said interpoly oxide is oxynitride with a thickness between about 200 to 300 Å.

19. The method of claim 1, wherein said depositing a second polysilicon layer over said interpoly oxide is accomplished with silicon source $SiH_4$ using LPCVD at a temperature between about 550 to 620° C.

20. The method of claim 19, wherein said second polysilicon layer to form a control gate has a thickness between about 1500 to 2500 Å.

* * * * *